United States Patent
Payne et al.

(10) Patent No.: US 6,387,723 B1
(45) Date of Patent: May 14, 2002

(54) REDUCED SURFACE CHARGING IN SILICON-BASED DEVICES

(75) Inventors: Alexander Payne, Ben Lomond; Christopher Gudeman, Los Gatos; James Hunter, Santa Clara; Michael Bruner, Saratoga; Clinton Carroll, Fremont, all of CA (US)

(73) Assignee: Silicon Light Machines, Sunnyvale, CA (US)

( * ) Notice: Subject to any disclaimer, the term of this patent is extended or adjusted under 35 U.S.C. 154(b) by 0 days.

(21) Appl. No.: 09/765,922

(22) Filed: Jan. 19, 2001

(51) Int. Cl.[7] ............................................. H01L 21/00
(52) U.S. Cl. ........................... 438/48; 438/64; 438/106
(58) Field of Search ........................... 438/26, 27, 106, 438/34, 38, 112, 115, 124, 126, 127, 48, 57, 64, 65, 66, 67

(56) References Cited

U.S. PATENT DOCUMENTS

| | | | | |
|---|---|---|---|---|
| 3,693,239 A | * | 9/1972 | Dix ............................. 29/470 |
| 4,558,171 A | * | 12/1985 | Gantley et al. .......... 174/52 FP |
| 5,126,826 A | * | 6/1992 | Kauchi et al. ................. 357/72 |
| 5,188,280 A | * | 2/1993 | Nakao et al. ............... 228/123 |
| 5,311,360 A | | 5/1994 | Bloom et al. ................ 359/572 |
| 5,694,740 A | * | 12/1997 | Martin et al. .................. 53/431 |
| 5,757,536 A | * | 5/1998 | Ricco et al. ................. 359/224 |
| 5,770,473 A | * | 6/1998 | Hall et al. ...................... 438/26 |
| 5,808,797 A | | 9/1998 | Bloom et al. ................ 359/572 |
| 5,837,562 A | * | 11/1998 | Cho ............................. 438/51 |
| 5,841,579 A | | 11/1998 | Bloom et al. ................ 359/572 |
| 6,004,912 A | | 12/1999 | Gudeman .................... 508/577 |
| 6,124,145 A | * | 9/2000 | Stemme et al. ................ 438/26 |
| 6,163,026 A | * | 12/2000 | Bawolek et al. ............. 250/351 |

* cited by examiner

*Primary Examiner*—John F. Niebling
*Assistant Examiner*—Angel Roman
(74) *Attorney, Agent, or Firm*—Haverstock & Owens LLP

(57) ABSTRACT

A method of treating silicon-based surfaces for reducing charge migration is disclosed. In accordance with the method, a silicon-based surface is treated with Nitrogen-rich pacifying gas environment, after the surface is actuated. The surface is actuated in a drying step, wherein residual water or moisture is removed from the surfaces at an elevated temperature and a reduced pressure. The method of the instant invention is particularly useful for the treatment of ribbon surfaces in grating light valve device, wherein after the ribbon surfaces are treated according to the current invention, surface charging remains low for several days, even in open air conditions.

21 Claims, 6 Drawing Sheets

REDUCED SURFACE CHARGING IN SILICON-BASED DEVICES

FIELD OF THE INVENTION

The invention relates to micro-machine devices fabricated from silicon-based materials. Specifically, the invention relates to the surface treatment of silicon-based materials to reduce charge build-up and charge migration.

BACKGROUND OF INVENTION

Grating light valves have applications in display, print, optical and electrical technologies. A grating light valve is a device that is capable of constructively and destructively interfering with an incident light source. Exemplary grating light valves and methods for making grating light valves are disclosed in the U.S. Pat. No. 5,311,360, U.S. Pat. No. 5,841,579 and U.S. Pat. No. 5,808,797, issued to Bloom et al., the contents of which are hereby incorporated by reference.

Grating light valve devices are micro-fabricated from Si-based materials using lithographic techniques. Grating light valve devices are configured to have a plurality of reflective ribbons which are moved by applying an operating bias voltage across the ribbons and a coupled substrate structure. By alternating, or switching, the bias voltage the ribbons are alternated between positions for constructive and destructive interfere with an incident light source having a wavelength $\lambda$.

The ribbons of the grating light valves are preferably formed of $Si_3N_4$ and the substrate structure is formed of Si or $SiO_2$. The surfaces of the ribbons and the substrate tend to be strongly hydrophilic and, thus, readily adsorb, physisorb, or chemi-adsorb water or moisture. Adsorbed, physisorbed, or chemi-adsorbed water or moisture on the operating surfaces of the ribbons and the substrate facilitates surface charging. Charging refers to the undesirable collection and migration electrical charges on the insulating surfaces of the grating light valve. Adsorbed, physisorbed, or chemi-adsorbed water or moisture is a difficult parameter to control within the manufacturing process of grating light valves and can severely diminish the performance of grating light valves.

One application for grating light valves is in the field of imaging and display devices, wherein one or more grating light valves are used create a pixel of an image or a pixel of an image on a display device. The presence of surface charging on the operating surfaces of grating light valves can perturb or shift the switching bias voltages. Thus, some of the grating light valves within the display device do not shut off, turn on and/or produce the desired intensity when a bias voltage is applied. The result is the undesirable persistence of an image, portions thereof or the complete failure of the device to produce the image.

To help ensure that charging is minimized, grating light valve structure are handled and manufactured in moisture free or near moisture free environments. Further, grating light valve structures are hermetically sealed within a die structure, after manufacturing, to maintain a moisture free environment. Processing and storing grating light valve structures in moisture free environments is time consuming and expensive. Further, the steps required to seal grating light structures within a die structure adds several steps to the fabrication process.

What is needed is a method to produce micro-fabricated grating light valve structures that exhibit reduced surface charging. Further what is needed is grating light valve structures that exhibit reduced surface charging in open air environments with typical humidity levels.

SUMMARY OF THE INVENTION

Grating light valves of the instant invention generate the condition for constructive and destructive interference through a plurality of movable ribbons. The movable ribbons provide a first set of reflective surfaces that are movable relative to a second set of reflective surfaces. The second set of reflective surfaces are reflective surfaces on a substrate element or on a second set of ribbons. In operation, an incident light source having a wavelength $\lambda$ impinges on the first set of reflective surfaces and the second set of reflective surfaces. The movable ribbons are displaced towards or away from the second set of reflective surfaces by $\lambda/4$, or a multiple thereof. The portion of light that is reflected from the first set of reflective surfaces and the portion of light that is reflected from the second set of reflective surfaces alternate between being in phase and being out of phase. Preferably, the first set of reflective surfaces and the second set of reflective surfaces are either in the same reflective plane or are separated $\lambda/2$ for generating the condition for constrictive interference.

FIG. 1a illustrates a grating light valve with plurality of movable ribbons 100 that are formed in a spatial relationship over a substrate 102. Both the ribbons 100 and the regions of the substrate between the ribbons have reflective surfaces 104. The reflective surface are provided by coating the ribbons 100 and the substrate with any reflective material such as an aluminum or silver. The height difference 103 between the reflective surfaces 104 on the ribbons 100 and the substrate 102 is $\lambda/2$. When light having a wavelength $\lambda$ impinges on the compliment of reflective surfaces 104, the portion of light reflected from the surfaces 104 of the ribbons 100 will be in phase with the portion of light reflected from the surfaces 104 of the substrate 102. This is because the portion of light which strikes the surfaces 104 of the substrate 102 will travel a distance $\lambda/2$ further than the portion of light striking the surface 104 of the ribbons 100. Returning, the portion of light that is reflected from the surfaces 104 of the substrate 102 will travel an addition distance $\lambda/2$ further than the portion of light striking the surface 104 of the ribbons 100, thus allowing the compliment of reflective surfaces 104 to act as a mirror.

Referring to FIG. 1b, in operation the ribbons 100 are displaced toward the substrate 102 by a distance 105 that is equal to $\lambda/4$, or a multiple thereof, in order to switch from the conditions for constructive interference to the conditions for destructive interference. When light having a wavelength $\lambda$ impinges on the reflective surfaces 104' and 104 with the ribbons 100' in the down position, the portion of light reflected from the surfaces 104' will be out of phase, or partially out of phase, with the portion of light reflected from the surfaces 104 and the total reflected light will be attenuated. By alternating the ribbon between the positions shown in FIG. 1a and FIG. 1b, the light is modulated.

An alternative construction for a grating light valve is illustrated in the FIGS. 2a–b. Referring to FIG. 2a, the grating light valve has a plurality of ribbons 206 and 207 that are suspended by a distance 205 over a substrate element 200. The ribbons 206 and 207 are provided with a reflective surfaces 204 and 205, respectively. Preferably, the surface 206 of the substrate 202 also are reflective. The first set of ribbons 206 and the second set of ribbons 207 are initially in the same reflective plane in the absence in the applied force. The first set of ribbons 206 and the second set of ribbons 207 are preferably suspended over the substrate by a distance 203 such that the distances between the reflective surfaces of the ribbons 206 and 207 and the reflective surfaces 208 of the substrate 202 are multiples of $\lambda/2$. Accordingly, the portions of light reflected from the surfaces 204 and 205 of the ribbons 206 and 207 and the reflective surface 208 of the substrate 202, with a wavelength $\lambda$ will all be in phase. The ribbons 206 and 207 are capable of being displaced relative to each other by a distance corresponding to a multiple of $\lambda/4$ and thus switching between the conditions for consecutive and destructive interference with an incident light source having a wavelength $\lambda$.

In the FIG. 2b, the second set of ribbons 207 are displaced by a distance 203, corresponding to a multiple of $\lambda/4$ of to the position 207'. The portion of the light reflected from the surfaces 205' of the ribbons 207 will destructively interfere with the portion of the light reflected from the surfaces 204 of the ribbons 206.

FIG. 3 plots and intensity response 307 of a grating light valve to an incident light source with a wavelength $\lambda$ when and voltage 308 is applied across a selected set ribbons (active ribbons) and the underlying substrate. From the discussion above, the brightness value will be at a maximum when the ribbons are in the same reflective plane, separated by $\lambda/2$, or a multiple of $\lambda/2$, and brightness will be at a minimum when the ribbons are separated by $\lambda/4$, or a multiple of $\lambda/4$.

The curve 306 illustrates the initial intensity response of a grating light valve to an applied voltages without significant surface charging. The curve 309 illustrates the intensity response for the same grating light valve to an applied voltage after surface charging has occurred. The curves 306 and 309 are offset by a value 310, which can be on the order of several volts. Such shifting in the intensity response curve is undesirable especially in display applications.

In display applications, the response of a grating light valve to an applied voltages is carefully calibrated to achieve a desired intensity level accurately. For example, eight bit voltage drivers subdivide the voltage curve, such as the voltage response curve illustrated in FIG. 3, into 265 grey levels. Clearly, a response curve shift of even a fraction of a Volt will seriously degrade the ability of the device to produce a desire intensity level.

Whether a grating light is constructed according to the principles illustrated in FIGS. 1a–b, FIGS. 2a–b, or any other construction utilizing ribbons moved by applying a bias across the ribbons and the substrate, there is the tendency for the ribbon surfaces and the substrate surfaces to exhibit charging. Charging on the surfaces of the ribbons and the substrate perturbs or the optical response causing the grating light valve to fail. Therefore, there is a need to provide grating light valve constructions which exhibit reduced charging.

According to the present invention, a micro-device which is fabricated from a silicon-based material and has silicon-based surfaces is treated with a pacifying gas to reduce surface charging. Preferably, the micro-device is a grating light valve with a plurality of movable ribbons comprising $Si_3N_4$ surfaces coupled to a substrate element comprising $SiO_2$ surfaces, wherein the ribbons alternate between the conditions for constructive and destructive interference with an incident light source having a wavelength $\lambda$ by apply the appropriate switching voltages across a selected portion of the ribbons and the substrate.

In accordance with the preferred method of the instant invention a grating light valve structure comprising silicon-based surfaces is placed in a vacuum environment with a pressure of $10^{-6}$ Torr or less. The grating light valve structure is heated in the vacuum environment to temperatures of at least 250 degrees Celsius for a period of time sufficient to remove residual water or moisture form the surfaces of the structure; preferably 1 hour or more. The grating light valve is then allowed to cool to ambient temperatures and is exposed to a pacifying gas environment. Alternatively, the device is treated with the pacifying gas at elevated temperatures and is then allowed to cool to ambient temperatures. A cycling process of placing the grating light valve in the vacuum environment, heating the grating light valve, exposing the grating light valve to the pacifying gas environment and cooling the grating light valve is performed any number of times to achieve the intended goal of pacifying the surface and reducing charging of the surfaces.

Preferably, the surfaces of the grating light valve are pacified within isolation chamber where a vacuum environment with a pressure of $10^{-7}$ Torr or less is achieved. Further, it is preferable that the pacifying gas used is substantially dried with a water content of less than 1 ppm. Further it is preferred that the pacifying gas contains a substantial amount of Nitrogen (50% or more) in combination with an noble Group VIII gas, such as Argon or Helium. Alternatively, the pacifying gas is approximately 100% dried Nitrogen.

After the grating light valve is cooled, the grating light valve is hermetically sealed within a die structure and installed in the intended device. Alternatively, the device is directly installed in the intended device and operates in an open air environment.

DETAILED DESCRIPTION OF THE INVENTION

In general, the present invention is for a grating light valve capable of alternating between the conditions for constructive and destructive interference with an incident light source. The grating light valve switches between the conditions for constructive and destructive interference through at least one set of movable ribbons. In accordance with the invention, the silicon-based surfaces of the grating light valve are treated with a pacifying gas to reduce surface charging to and help achieve consistent performance. Further the invention seeks to pacify the silicon-based surface of grating light valve devices, such that they are capable of operating in an open air environment with typical humidity or moisture levels. Alternatively, a grating light valve structure is sealed within a die structure after treatment of the surfaces to further enhance the consistency and performance of the device. The invention is also used to the other micro-structures the silicone-based surfaces which exhibit charging leading to degraded performance.

In the preferred embodiment of the present invention the silicon-based surfaces of a grating light valve are treated to drying conditions and then exposed to a pacifying gas environment containing Nitrogen. The pacifying gas environment most preferably is dried Nitrogen or is a mixture of dried Nitrogen and noble Group VIII gas including He, Ne, Ar, Kr, Xe, Rn or mixture thereof.

Figure 1A:
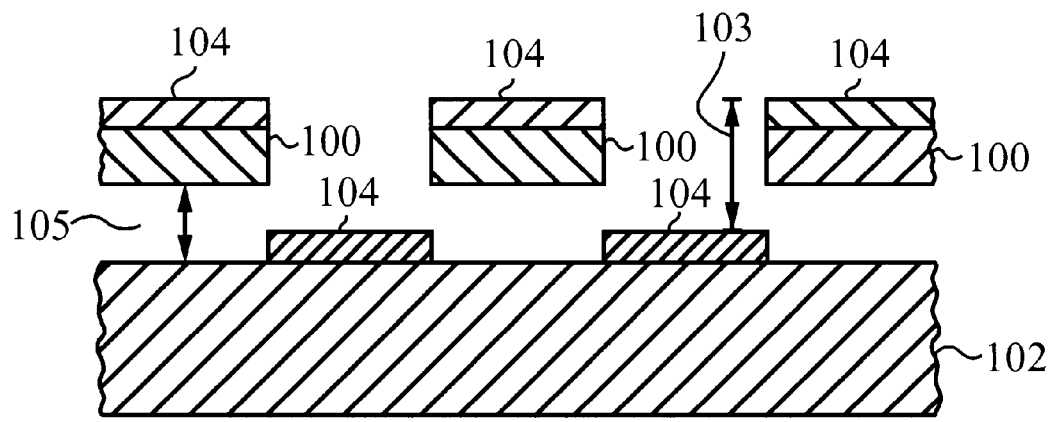
FIG. 1a is a cross-sectional view of a grating light valve with reflective ribbons in the constructive interference position.
Figure 1B:
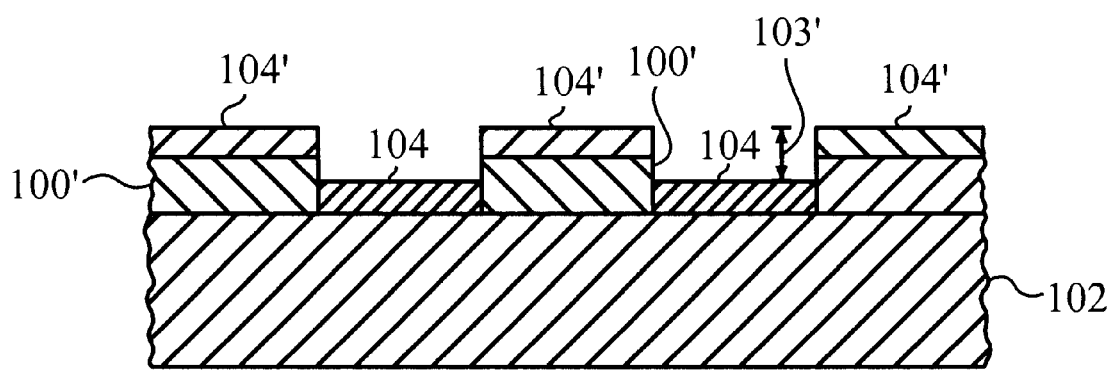
FIG. 1b is a cross-sectional view of the grating light valve, shown in FIG. 1a, with the active ribbons displaced to the destructive interference position.
Figure 2A:
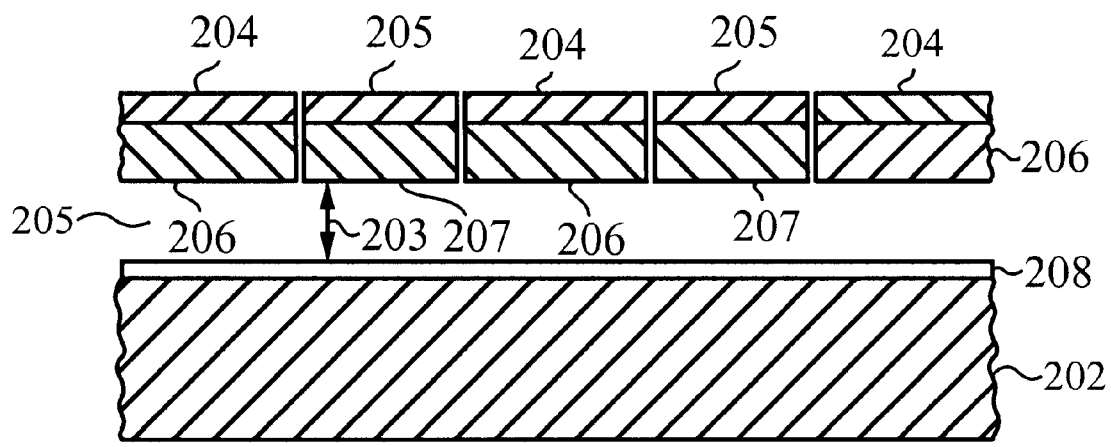
FIG. 2a is a cross sectional view of the grating light valve with set of active ribbons and a set of bias ribbons in the same reflective plane.
Figure 2B:
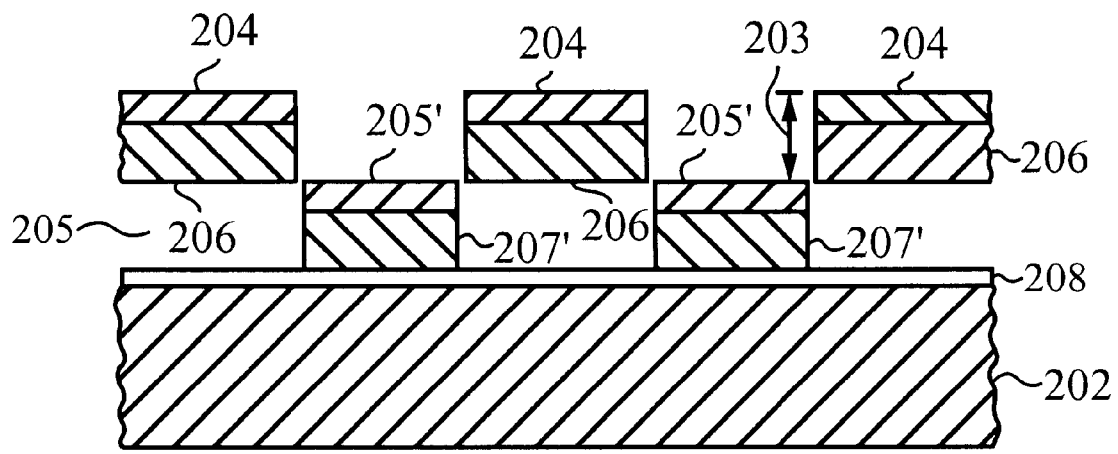
FIG. 2b is a cross sectional view of the grating light in FIG. 2a with the active ribbons displaced from the bias ribbons to the destructive interference position.
Figure 3:
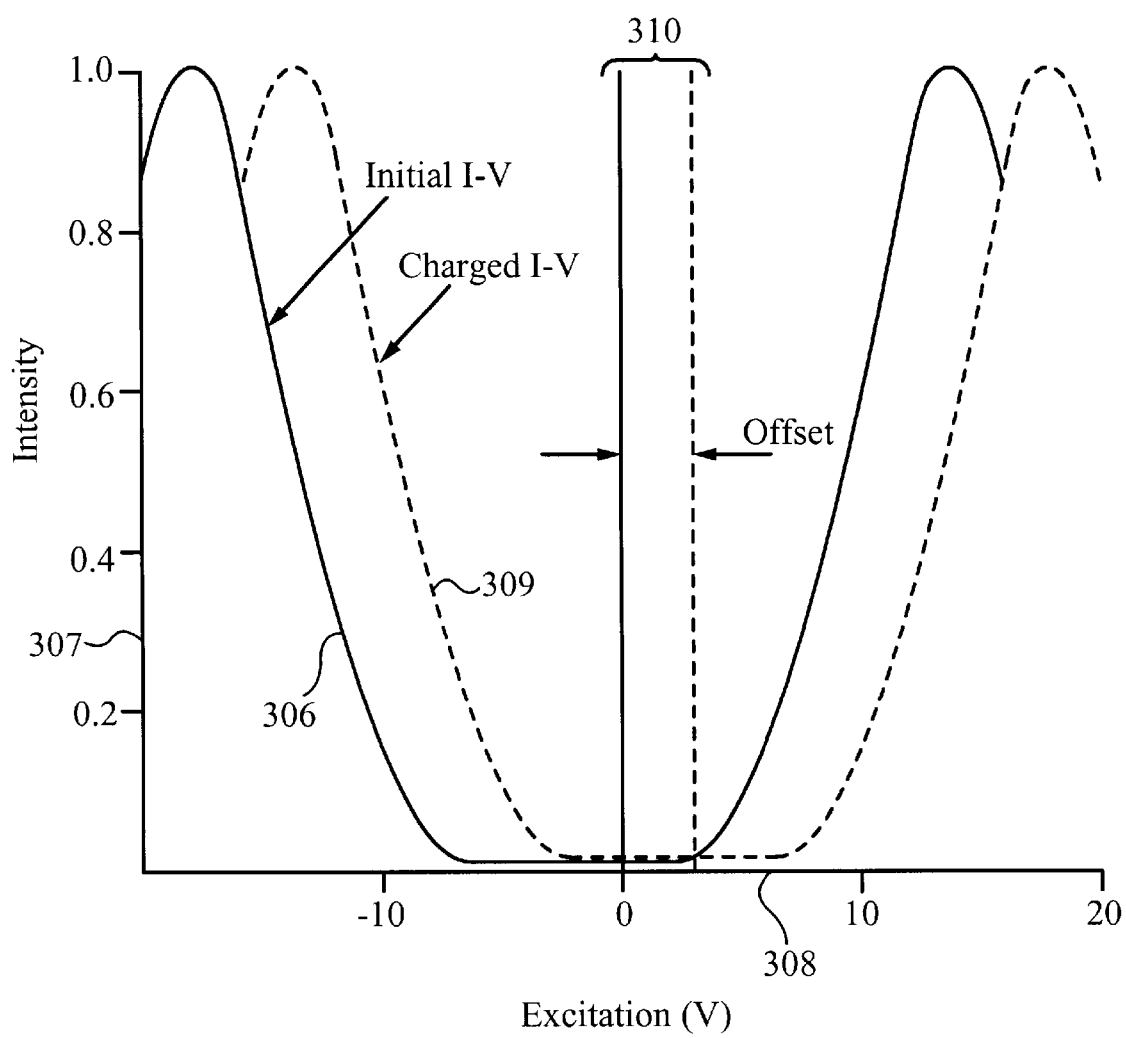
FIG. 3 is a plot of the brightness response versus bias voltages applied to a grating light valve.
Figure 4:
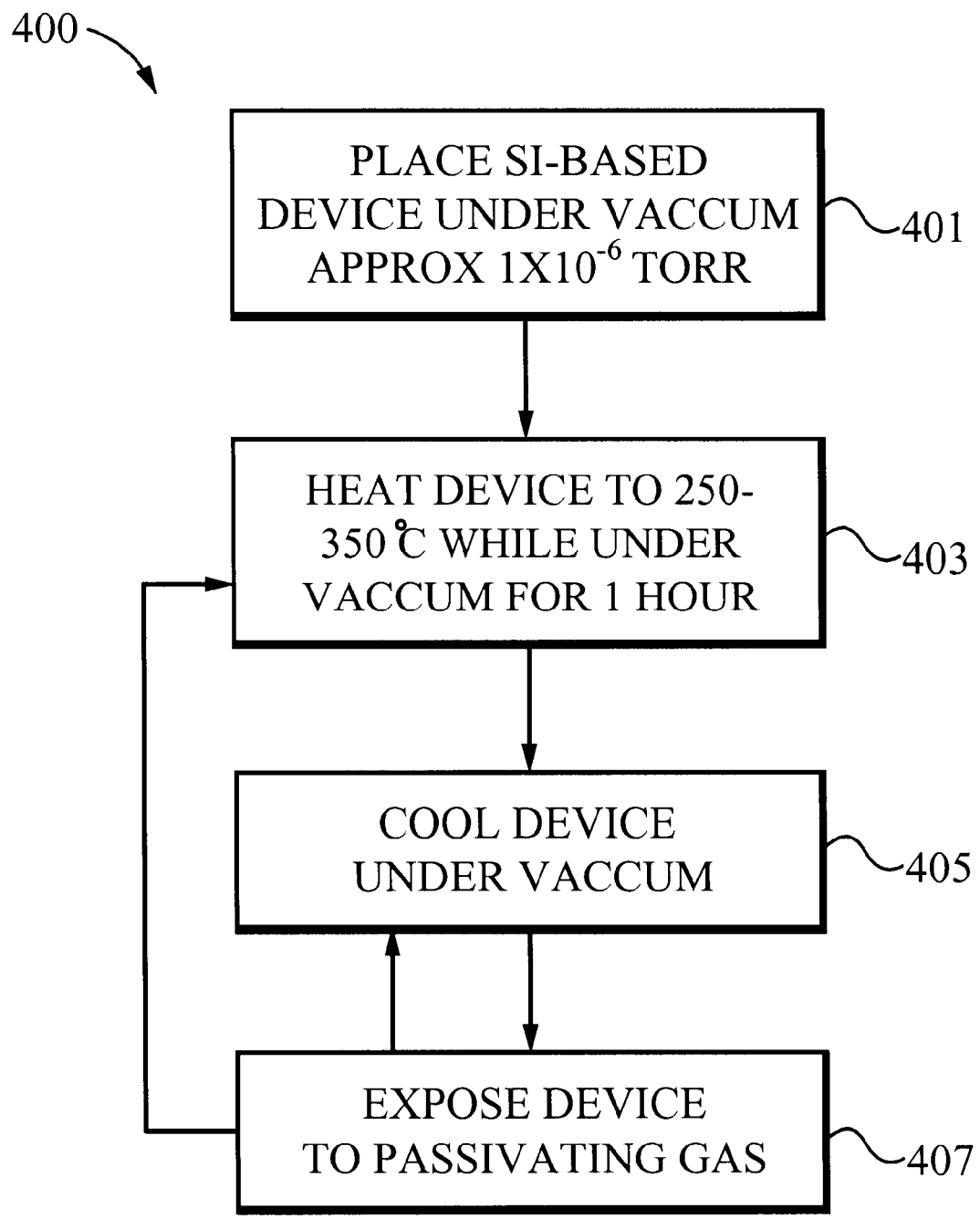
FIG. 4 is a block diagram for the method of making and grating light valve with treated surfaces, in accordance with the current invention.

FIG. 4 is a block diagram outlining the steps for treating the silicon-based surfaces of a grating light valve device to drying conditions and exposing the surfaces to a pacifying gas environment, in accordance with the instant invention. In the step 401, and prior to the step 407, the structure is placed in a vacuum with a pressure of $10^{-6}$ Torr or less, and preferably $10^{-7}$ or less. In the step 403, the temperature of the structure is elevated to a temperature of at least 250 to 350 degrees Celsius for a period that is sufficient to drive off a portion of the adsorbed, physisorbed, or chemi-adsorbed water, moisture and other volatile materials form the surface of the device; preferably, one hour or longer. After the surfaces of the device are dried, in the step 403, then in the step 405 the structure is allowed to cool to ambient temperatures between 20 and 30 degrees Celsius. After the structure is allowed to cool to ambient temperatures in the step 405, then in the step 407 the structure surfaces are exposed to the pacifying gas environment.

It is understood that the step 401 of placing the device in a vacuum environment and the step 403 of heating the device can be performed concurrently, separately and in any order. What is important is that the elevated temperature is maintained while the structure in a vacuum to facilitate the removal of adsorbed, physisorbed, or chemi-adsorbed water, moisture and other volatile materials from the structure surfaces. Further, while it is preferable to allow the device to cool to ambient temperatures in the step 405 prior to the step 407 of exposing the structure to the pacifying gas environment, the structure may also be exposed to the pacifying gas environment in the step 407 without cooling the structure in the step 405. Further, it is understood that the steps 401–407 can be repeated any number of time to achieve the desired result of pacifying the silicon-based surfaces of the structure.

Figure 5:
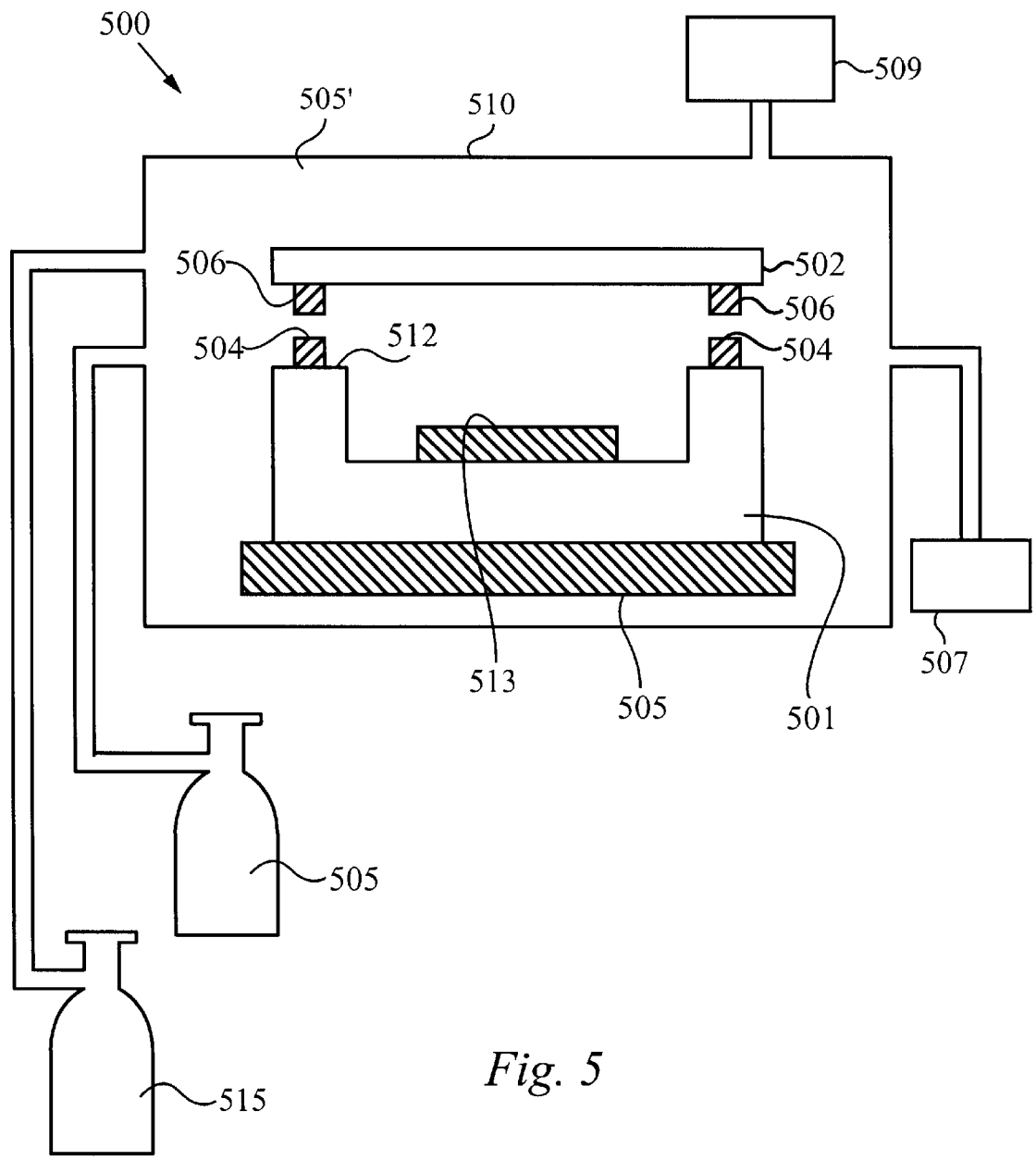
FIG. 5 is a schematic representation of a isolation chamber used in the preferred method of the instant invention.

FIG. 5 illustrates an apparatus 500 configured for use in the preferred method of the instant invention. A grating light valve structure 513 is placed within an isolation chamber 510. The isolation chamber 510 is in communication with a vacuum device 407, a pressure meter 509 and a pacifying gas source 505. A vacuum is drawn through isolation chamber 510 with the vacuum device 507, until the pressure meter 509 reads approximately $10^{-6}$ Torr or less. The temperature of the grating light valve structure 513 is elevate with a heating element 408 to a temperature of 250 degrees Celsius or higher. The above stated conditions are maintained for a period of time that is sufficient remove a substantial portion of residual water from the surface of the structure. The period of time for drying varies depending on the structure, surface areas, pressure used and temperature used. But good results for treating the silicone-based surface of grating light valve structures has been observed within an hour of drying time.

Still referring to FIG. 5, the pacifying gas 505 is a Nitrogen-rich gas as previously described. After the grating light valve structure 513 is dried, the grating light valve structure 513 is preferably allowed to cool to ambient temperatures. The grating light valve structure 513 is then exposed to a pacifying gas environment 505 by back filling the isolation chamber 510 with the Nitrogen-rich gas source 505. The pressure of the Nitrogen-rich pacifying gas within the isolation camber 510 is adjusted to any reasonable value but is preferably adjusted to a value between 0.5 and 6.0 Torr. The procedure described is cycles any number of times to pacify the silicon-bases surface of the grating light valve structure.

After the silicon-based surfaces of the grating light valve structure have been treated, the grating light valve structure can be used in open air conditions. Alternatively, the grating light valve is sealed within a die structure 501 using a glass cap 502. Because the die structure 501 and the glass cap 502 also have silicon-based surfaces, they are also treated to the drying conditions and exposed to the pacifying gas as described in detail above.

To seal the grating light valve 513 within the dies structure 501, a preformed metallized gasket 504 is provided on a sealing edge 512 of the die structure 501. The glass cap 502 is provided complementary preformed metallized gasket 506. The performed gasket is preferably a Au/Sn eutectic solder preformed gasket. The glass cap 502 is placed on the die structure 501 with gaskets 504 and 506 aligned and overlapping.

Prior to sealing the grating light valve structure 513 within the die structure 501, the gas environment 505' within the isolation chamber 510 is modified with a second gas source 515. The second gas source 515 is preferably a noble group VIII gas. The Nitrogen-rich pacifying gas environment is removed by applying a vacuum to the isolation chamber 510 with the vacuum device 507 and then backfilling the isolation chamber 510 with the second gas source 515. Once the preferred gas environment is achieved within the isolation chamber 510, then the temperature of the die structure 501 and the glass cap 502 are adjusted with the heating element 508 to a sealing temperature of approximately 300 degrees Celsius ±50, depending on the gasket materials that are used. The sealing temperature is maintained for approximately 10 minutes or a period of time that is sufficient to cause the metallized gaskets 504 and 506 to melt and solder the glass cap 502 to the die structure 501 and, thus, encapsulating a portion of the gas environment 505' therein. The sealed die structure (not shown) is then cooled and removed from the isolation chamber 510 to be installed and used in the desired device.

Figure 6A:
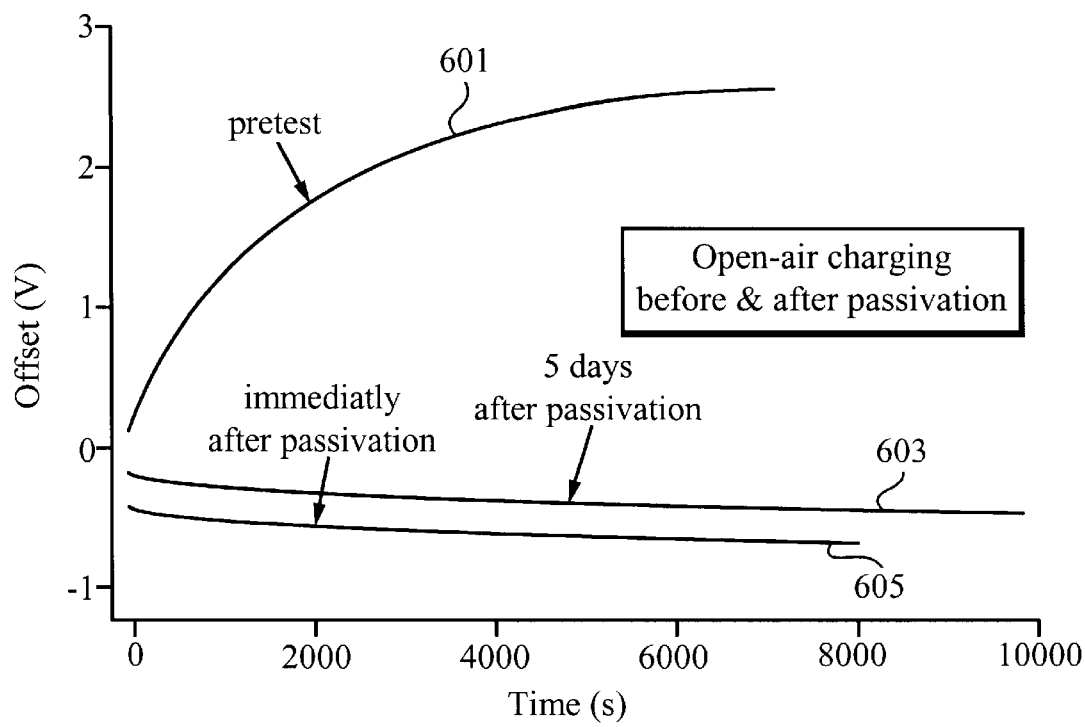
FIG. 6a is a plot comparing the open air charging of a treated silicon-based surface, in accordance with the current invention, and the same surface untreated.

FIG. 6a plots charging values observed for a silicon-based surface prior to and after treatment of the surfaces in accordance with the instant invention. In these measurements, a continues 12 Volt DC basis was placed across the $Si_3N_4$ ribbons of a grating light valve and the offset voltage was periodically measured. The line 501 plots charging values of the silicon-based surface prior to treatment. The curve 501 is a typical charge curve for a silicon-based surface that is undried and that has been exposed to open air conditions. The surface accepts a charge quickly at first and then tappers off with time as the surface reaches charge saturation. Line 506 plots charging values for the same silicon-based surface after being treated in accordance with instant invention. It is clear form the curve 506 that the treated surface does not ready accept a charge as observed for the surface prior to the treatment. Further, even after 5 days in open air conditions the surface does not readily accept a charge as illustrated by the charging values plotted on the 603.

Figure 6B:
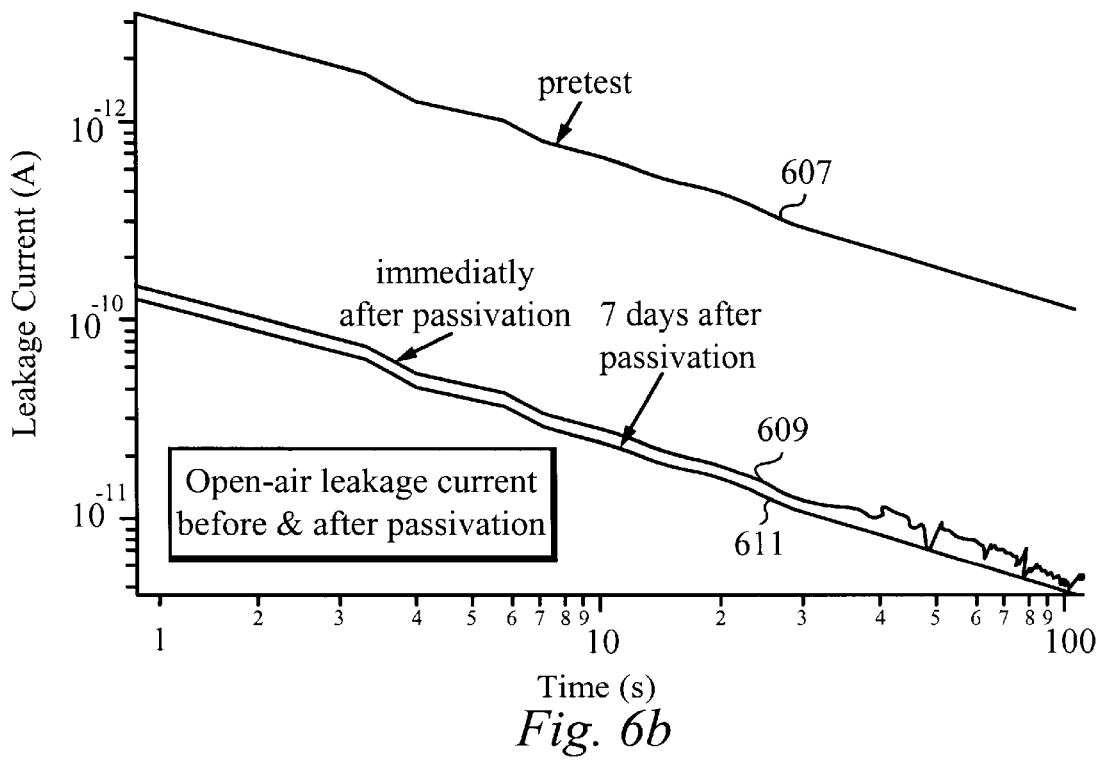
FIG. 6b is a plot comparing leakage current of a treated silicon-based surface, in accordance with the current invention, and the same surface untreated.

FIG. 6*b* plots leakage current leakage values, which provides a signature for charge migration, measured on a silicon-based surface prior to treatment and after treatment in accordance with the current invention. The current leakage values plotted on line 607 for the untreated silicon-based surface are significantly higher than the current leakage values plotted on the line 609 for the same silicon-based surface after treatment. Further even after 7 day in open air condition the current leakage values of the treated silicon-based surface, plotted on the line 611, remain low. In this example, the passivation process reduce the leakage currents measured by approximately 50 times. The low charging values and leakage current values observed for silicon-based surfaces after treatment in accordance with the present invention, indicate a potential for grating light valve structure that are capable of operating in open air environments with typical humidity and moisture levels.

The present invention has been described relative to a preferred embodiment. Improvements or modifications that become apparent to persons of ordinary skill in the art only after reading this disclosure are deemed within the spirit and scope of the application. Specifically, treatment of silicon-based surfaces as described above is not limited to grating light valves and may be used to treat other silicon-based surfaces where charging in a concern. Further, it is understood that practicing the instant invention is not dependent on a particular grating light valve construction chosen.

What is claimed is:

1. A method of treating a silicon-based surfaces of a micro-device structure comprising a plurality of movable surfaces, the method comprising:
   a. placing the micro-device structure in a vacuum environment;
   b. maintaining the temperature of the micro-device structure at 250 Celsius or higher while the micro-device structure is in the vacuum environment; and
   c. exposing the micro-device structure to a Nitrogen rich pacifying gas environment after maintaining the temperature of the micro-device structure at 250 Celsius or higher.

2. The method of claim 1, wherein the micro-device structure is a grating light valve structure comprising a plurality of spatially arranged ribbons formed from $Si_3N_4$ and a substrate structure comprising silicon, wherein the ribbons configured to switched between the conditions for constrictive and destructive interference with an incident light source λ by applying a bias voltage across a portion of the movable ribbons and the substrate structure.

3. The method of claim 1, wherein the Nitrogen-rich pacifying gas environment is adjusted to pressure between 0.5 atmospheres and 6 Torr.

4. The method of claim 1, wherein the a partial pressure of Nitrogen in the Nitrogen-rich pacifying gas environment is in a range 0.25 to 3.0 Torr.

5. The method of claim 4, wherein the Nitrogen-rich pacifying gas environment further comprises an inert gas selected from a group consisting of He, Ar, Kr, Xe and Rn.

6. The method of 1, wherein the vacuum environment is maintained at a pressure of $10^{-6}$ Torr, or less.

7. The method of claim 1, wherein the micro-device structure is cooled to ambient temperature in a range of 20 to 30 degrees Celsius prior to the step of exposing the micro-device structure to the Nitrogen-rich pacifying gas environment.

8. The method of claim 1, wherein the steps of placing the micro-device structure in a vacuum, maintaining the temperature of the micro-device structure at 300 Celsius or higher while the micro-device structure in the vacuum environment and exposing the micro-machine to a Nitrogen rich pacifying gas environment are performed within an isolation chamber.

9. The method of claim 1, further comprising a step of sealing the micro-device structure in a die structure after the step of exposing the micro-device structure to the Nitrogen-rich pacifying gas environment.

10. The method of claim 9, further comprising the step of providing an inert gas environment prior to the step of sealing the micro-device in a die structure, the inert gas environment comprising a noble gas selected from the group consisting of He, Ar, Kr, Xe and Rn.

11. The method of claim 9, wherein the step of sealing the micro-device within the die structure comprises the additional steps of:
   a) providing a metallized gasket around a sealing edge of the die structure;
   b) providing a glass cap with a complimentary metallized gasket;
   c) placing the glass cap over the die and aligning the metallized gaskets such that the gaskets are in contact; and
   d) adjusting the temperature of the die structure and the glass cap to a temperature sufficient to melt the gaskets and solder the glass cap to the die structure.

12. A method of making a grating light valve device comprising the steps of
   a. removing moisture from surfaces of a grating light valve structure and a die structure by placing the grating light valve structure in a vacuum environment and maintaining the temperature of the grating light valve structure at temperature of 250 Celsius or higher while the grating light valve structure is in the vacuum the environment;
   b. exposing the grating light valve structure and the die structure with a Nitrogen-rich pacifying gas environment after maintaining the temperature of the grating light valve structure at 250 Celsius or higher; and
   c. sealing the die structure with the grating light valve structure within the die structure.

13. The method of claim 12, wherein the step of exposing the grating light valve structure and the die structure and the step of sealing the grating light valve within the die structure are performed in an isolation chamber.

14. The method of claim 12, further comprising the step of providing a inert gas environment within the isolation chamber prior to the step of sealing the grating light valve structure in the die structure.

15. The method of claim 12, wherein the step of sealing grating light valve structure within the die structure comprises the additional steps of:
   a. providing a metallized gasket around a sealing edge of the die structure;
   b. providing a glass cap with a complimentary metallized gasket;

c. placing the glass cap over the die structure and aligning the metallized gaskets such that the gaskets are in contact; and d. adjusting the temperature of the die structure and the glass cap to a temperature sufficient to melt the gaskets and solder the glass cap to the die structure.

16. The method of claim 12, wherein the Nitrogen-rich pacifying gas environment is adjusted to a pressure between 0.5 Torr and 6 Torr.

17. The method of claim 12, wherein the a partial pressure of Nitrogen in the Nitrogen-rich pacifying gas environment is in a range 0.25 to 3.0 Torr.

18. The method of claim 17, wherein the Nitrogen-rich pacifying gas environment further comprises an inert gas selected from a group consisting of He, Ar, Kr, Xe and Rn.

19. The method of 13, wherein the vacuum environment is adjusted to a pressure below $10^{-6}$ Torr, or less.

20. The method of claim 13, wherein the grating light valve structure is cooled to ambient temperature in a range of 20 to 30 degrees Celsius prior to the step of exposing the grating light valve structure to the Nitrogen-rich pacifying gas environment.

21. The method of claim 13, wherein the grating light valve structure is cooled to ambient temperature in a range of 20 to 30 degrees Celsius prior to the step of exposing the grating light valve structure to the Nitrogen-rich pacifying gas environment.

* * * * *

UNITED STATES PATENT AND TRADEMARK OFFICE
CERTIFICATE OF CORRECTION

PATENT NO.     : 6,387,723 B1
DATED          : May 14, 2002
INVENTOR(S)    : Alexander Payne et al.

It is certified that error appears in the above-identified patent and that said Letters Patent is hereby corrected as shown below:

Column 8,
Line 11, insert -- is -- between "structure" and "in".

Signed and Sealed this

Tenth Day of December, 2002

JAMES E. ROGAN
*Director of the United States Patent and Trademark Office*